(12) United States Patent
Srivastava

(10) Patent No.: US 10,554,209 B2
(45) Date of Patent: Feb. 4, 2020

(54) ADAPTIVE AGING TOLERANT APPARATUS

(71) Applicant: Intel Corporation, Santa Clara, CA (US)

(72) Inventor: Amit Kumar Srivastava, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 15/933,043

(22) Filed: Mar. 22, 2018

(65) Prior Publication Data

US 2019/0296746 A1 Sep. 26, 2019

(51) Int. Cl.
*H03L 1/00* (2006.01)
*H03K 3/03* (2006.01)
*H03L 7/099* (2006.01)

(52) U.S. Cl.
CPC .............. *H03L 1/00* (2013.01); *H03K 3/0315* (2013.01); *H03L 7/0995* (2013.01)

(58) Field of Classification Search
CPC ....................................................... H03L 1/00

USPC ............................................................. 331/2
See application file for complete search history.

(56) References Cited

U.S. PATENT DOCUMENTS

| | | | |
|---|---|---|---|
| 2014/0197895 A1* | 7/2014 | Chen ................... | G01R 31/2882 331/57 |
| 2014/0225639 A1* | 8/2014 | Guo ......................... | H03K 3/84 326/8 |
| 2015/0214955 A1* | 7/2015 | Calhoun ................... | G06F 1/04 331/47 |

* cited by examiner

*Primary Examiner* — Joseph Chang

(74) *Attorney, Agent, or Firm* — Green, Howard, & Mughal LLP

(57) ABSTRACT

An apparatus is provided which comprises: a first ring oscillator comprising at least one aging tolerant circuitry; a second ring oscillator comprising a non-aging tolerant circuitry; a first counter coupled to the first ring oscillator, wherein the first counter is to count a frequency of the first ring oscillator; a second counter coupled to the second ring oscillator, wherein the second counter is to count a frequency of the second ring oscillator; and logic to compare the frequencies of the first and second ring oscillators, and to generate one or more controls to mitigate aging of one or more devices.

20 Claims, 13 Drawing Sheets ered aging degradation as compared to transistors developed in planar technologies. Digital circuit performance is degraded due to aging in two ways: (1) functional degradation, which is due to aging circuits stop performing or degrade significantly over lifetime, and (2) device failure, which is due to excessive aging that triggers an irreversible dielectric breakdown of transistors, leading to an instantaneous failure of the corresponding circuit. Due to the exponential voltage dependency of aging, digital circuits age where transistors are exposed to voltages beyond the CMOS device operating limits. One of the digital circuit topologies where internal nodes are exposed to voltages beyond the device target limit are stacked transistor configurations. In stacked transistor circuit topologies, internal nodes in the stack may see transient overshoot voltage (e.g., more than +/−10% tolerant limit). This transient overshoot may cause circuit degradation at a much faster rate than anticipated.

ADAPTIVE AGING TOLERANT APPARATUS

BACKGROUND

Complementary Metal Oxide Semiconductor (CMOS) transistors developed in FinFET (Fin Field Effect Transistor) technologies generally suffer from enhanced aging degradation as compared to transistors developed in planar technologies. Digital circuit performance is degraded due to aging in two ways: (1) functional degradation, which is due to aging circuits stop performing or degrade significantly over lifetime, and (2) device failure, which is due to excessive aging that triggers an irreversible dielectric breakdown of transistors, leading to an instantaneous failure of the corresponding circuit. Due to the exponential voltage dependency of aging, digital circuits age where transistors are exposed to voltages beyond the CMOS device operating limits. One of the digital circuit topologies where internal nodes are exposed to voltages beyond the device target limit are stacked transistor configurations. In stacked transistor circuit topologies, internal nodes in the stack may see transient overshoot voltage (e.g., more than +/−10% tolerant limit). This transient overshoot may cause circuit degradation at a much faster rate than anticipated.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1B:
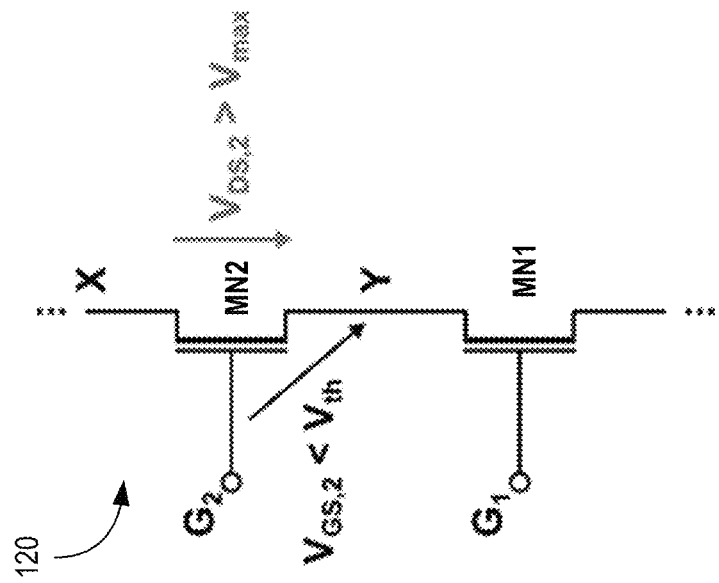
FIG. 1B illustrates the stacked circuit configuration when a transistor in the stack is off which may cause excessive aging and a failure of that transistor.

Some embodiments describe an adaptive aging tolerant circuit technique and chip-level scheme that compares aging conditions of an aging tolerant circuit with an aged circuit (e.g., a non-aging tolerant circuit), and then analyzes the aging conditions to generate a configuration code (which may be two or more bits) to adjust configuration parameters of various circuits that may be susceptible to aging related damage or performance degradation. The configuration parameters may relate to digital circuits (e.g., standard library cells such as NAND gates, NOR gates, XOR gates, XNOR gates, inverters, flip-flops, etc.) and/or analog circuits (e.g., phase locked loops, charge pumps, bias circuits, input-output transmitters etc.).

The configuration parameters may include changing power supply levels, up-scaling or downscaling frequency of operation, changing Phase Locked Loop (PLL) clock frequency or internally generated ring oscillator clock frequencies, command to change sizing of various transistors to change transistor design parameters (e.g., gain, bandwidth, transconductance, output impedance current driving capability, etc.), command to change biasing (current or voltage) of certain nodes, commands to change termination impedance, command to throttle input-output transceiver data rates (e.g., in memory or other High Speed applications), changing cooling system parameters (e.g., fan speed, flow of cooling agent), etc. By adjusting the configuration parameters adaptively, aging degradation of the circuits is slowed down which allows for the circuits to operate normally for a longer period of time and hence increase the useful like of a processor. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Due to the exponential voltage dependency of aging, digital circuits age where transistors are exposed to voltages beyond the CMOS device operating limits. One of the digital circuit topologies where internal nodes are exposed to voltages beyond the device target limit are stacked transistor configurations.

Figure 1A:
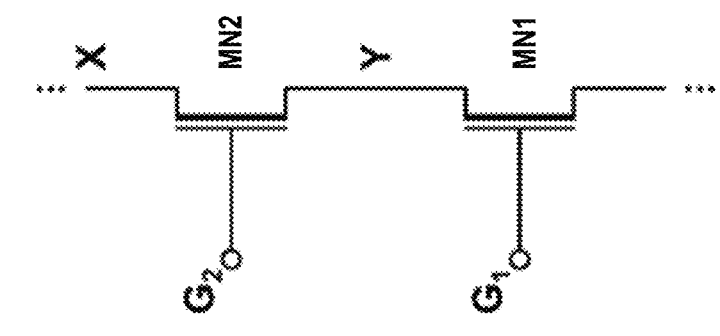
FIG. 1A illustrates a stacked circuit configuration.

FIG. 1A illustrates a stacked circuit configuration 100. Configuration 100 is widely used for circuits like logic circuits, I/O (input-output) interfaces, DC-DC converters, power amplifiers, etc. Stacked circuit configuration 100 comprises two stacked n-type transistors referred to as transistors MN1 and MN2. Here, n-type transistors are shown in a stack configuration, however, the problems of aging are also applicable to p-type transistors in a stack. To avoid excessive aging of devices, the voltage between the two transistor terminals (e.g., between the gate and the source or between the drain and the source) are limited to a maximum voltage $V_{max}$. Typically, $V_{max}=1 \cdot |V_{DD,nom}$ is used as a limit, where $V_{DD,nom}$ is the nominal supply voltage of the corresponding device.

FIG. 1B illustrates the stacked circuit configuration 120 when transistor in the stack is off which may cause excessive aging and a failure of that transistor. During the design of stacked topologies, special attention is given to the drain source voltage of the upper transistor MN2, $V_{DS,2}$. When n-type transistor MN2 is turned off, e.g., when the gate source voltage of n-type transistor MN2, $V_{DS,2}$, is smaller than or equal the threshold voltage $V_{th}$ of n-type transistor MN2 (e.g., $V_{GS,2} < V_{th}$), $V_{DS,2}$ can become higher than $V_{max}$ (e.g., $V_{DS,2} > V_{max}$) as node 'Y' is a high impedance node (e.g., floating node) which is susceptible to any coupling or noise. Here, the term "$V_{max}$" is the voltage above which a transistor of a process node is damaged if that voltage is applied for a certain amount of time. Excessive voltage beyond the operating limits can lead to device degradation due to aging, and thus a failure of transistor MN2, and may limit the circuit functionality.

As FinFET geometry shrinks to 14 nm or 10 nm or 7 nm, device geometry is more susceptible to aging than planer transistors. Even moderate operating voltage, beyond the one specified by a process node, lead to a failure for standard circuit topologies. Similar problems may also exist for some of the external small geometry processes either planar or silicon-on-insulator (SOI) technologies. Various embodiments provide an aging tolerant circuit technique which mitigates aging at smaller process geometries.

Figure 1D:
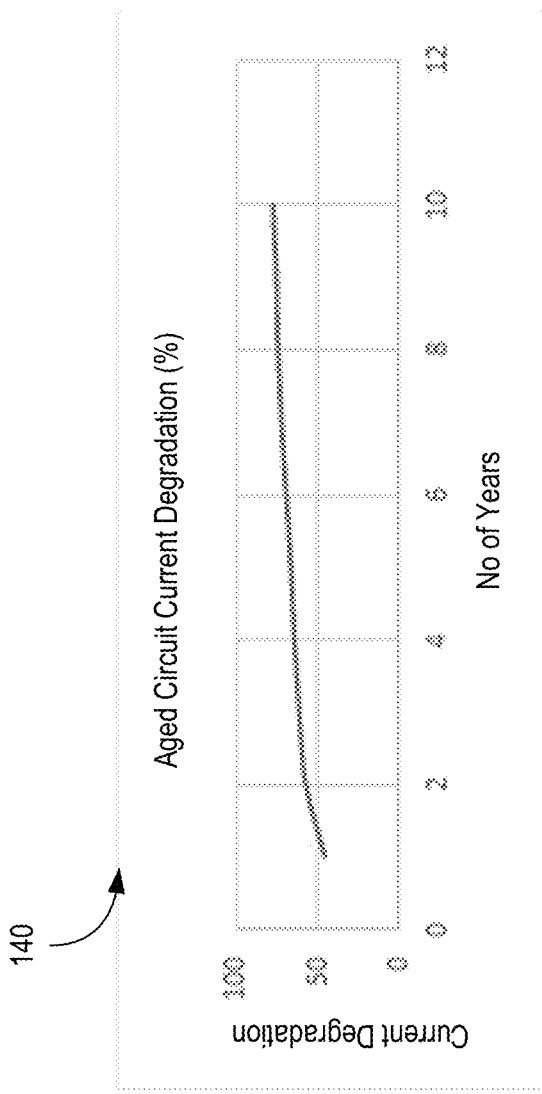
FIG. 1D illustrates a plot showing circuit degradation during aging for stacked transistors.
Figure 1E:
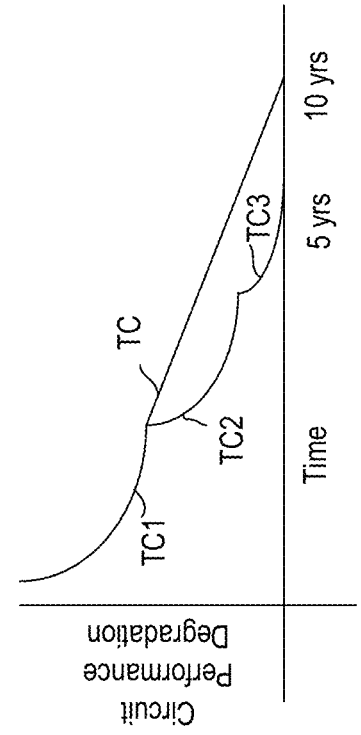
FIG. 1E illustrates a plot showing real system aging vs. modeled aging.
Figure 1C:
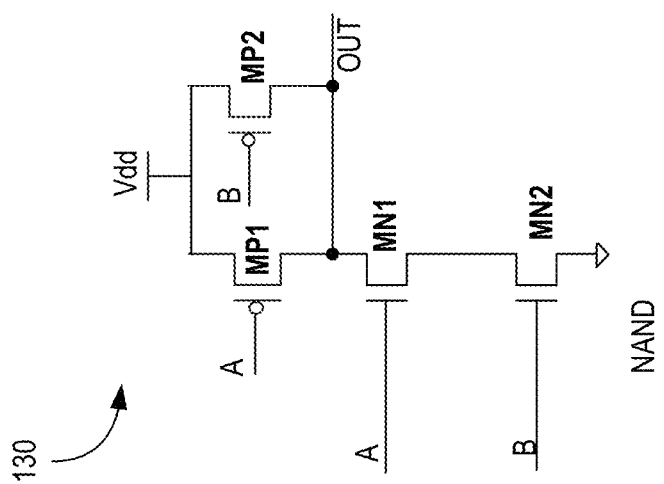
FIG. 1C illustrates another stacked circuit (e.g., a NAND gate) where an internal node can excessively age due to voltage overshoot.

FIG. 1C illustrates another stacked circuit (e.g., a NAND gate) 130 where an internal node can excessively age. Due to the exponential voltage dependency of aging, CMOS circuits are severely degraded where transistors are exposed to voltages beyond the CMOS device operating limits. Most of digital circuit topologies where internal nodes are exposed to voltages beyond the device target limits, especially in stacked transistor configurations, degrade much faster compared with non-stacked transistor configuration. This degradation can result in functional loss and may limit the product safe-cycle time.

Circuit 130 comprises n-type transistors MN1 and MN2, and p-type transistors MP1 and MP2 coupled together as shown. The transistors are controllable by inputs A and B, where OUT is the output. The intermediate node n1 shared by transistors MN1 and MN2 suffers from aging degradation because this intermediate node experiences voltages that overshoot during transients. The overshoot can be more than +/−10% of the tolerant limit. As such, the overshoot on node n1 can cause circuit degradation at a much faster rate compared to expected or simulated aging data provided by a process design team.

FIG. 1D illustrates plot 140 showing current degradation during aging for stacked transistors. The x-axis is number of years (No. of Years) while the y-axis is percentage of current degradation through node n1. Plot 140 shows that current flow degrades by over 75% in a period of 10 years.

FIG. 1E illustrates plot 150 showing real system aging vs. modeled aging. Here, x-axis is time and y-axis is percentage of circuit performance degradation. Most process data that is used to predict aging degradation uses exponential degradation based on a time constant (TC). However, in real systems, a circuit ages with different time constants (e.g., time constants TC1, TC2, TC2 every year) which result in severe degradation. Plot 150 shows that process estimation data based on simulation predicts that the circuit design should be able to degrade after 10 years, while actual products in normal use degrade in less than 5 years. This discrepancy in predicted aging of circuits versus actual aging of circuits is due to the observation that devices degrade with different time constants (TC1, TC2, TC3, for example), and result in faster degradation than predicted.

Figure 2:
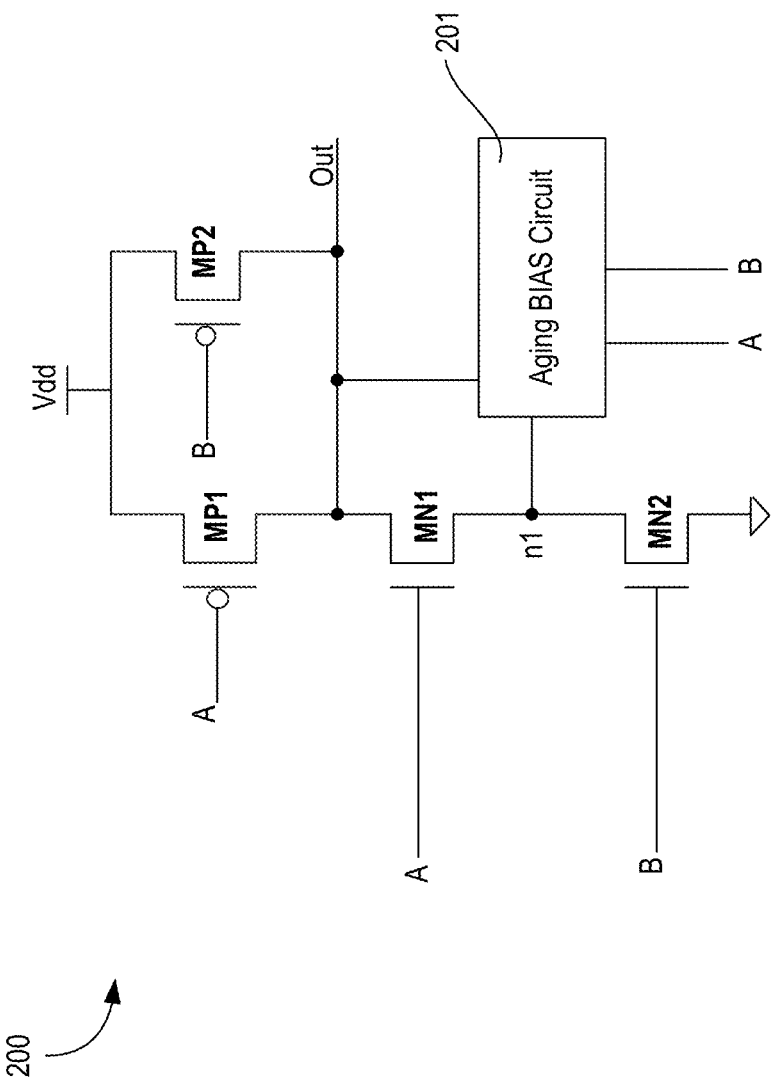
FIG. 2 illustrates a stacked circuit configuration with aging tolerant apparatus, according to some embodiments of the disclosure.

FIG. 2 illustrates a stacked circuit configuration with aging tolerant apparatus or circuit 200, according to some embodiments of the disclosure. Continuing with the example of circuit 130, in some embodiments, an aging bias 201 is provided to bias internal nodes n1 and/or Out depending on the inputs A and B, and/or a configuration code provided by an external configuration code. This configuration code may be generated by a logic that takes into account aging condition of a sample circuit compared with an aging tolerant sample circuit. In some embodiments, the aging bias circuit comprises a selection of bias voltages (e.g., generated by a resistive ladder or voltage divider) and this bias is then added or subtracted from the internal node n1 to delay degradation on that node. In some embodiments, apparatus 200 is used as an aging tolerant circuit-based oscillator to provide a reference aging performance of a circuit.

In some embodiments, aging bias circuit 201 is used to fix or set internal biases by generating an output which is a function of inputs and the output(s). In this example, inputs are A, B and output is Out. In some embodiments, aging bias circuit 201 can be a voltage clamp circuit or a current clamp circuit, or another special circuit whose output is dependent on inputs and outputs.

Figures 3A, 3B:
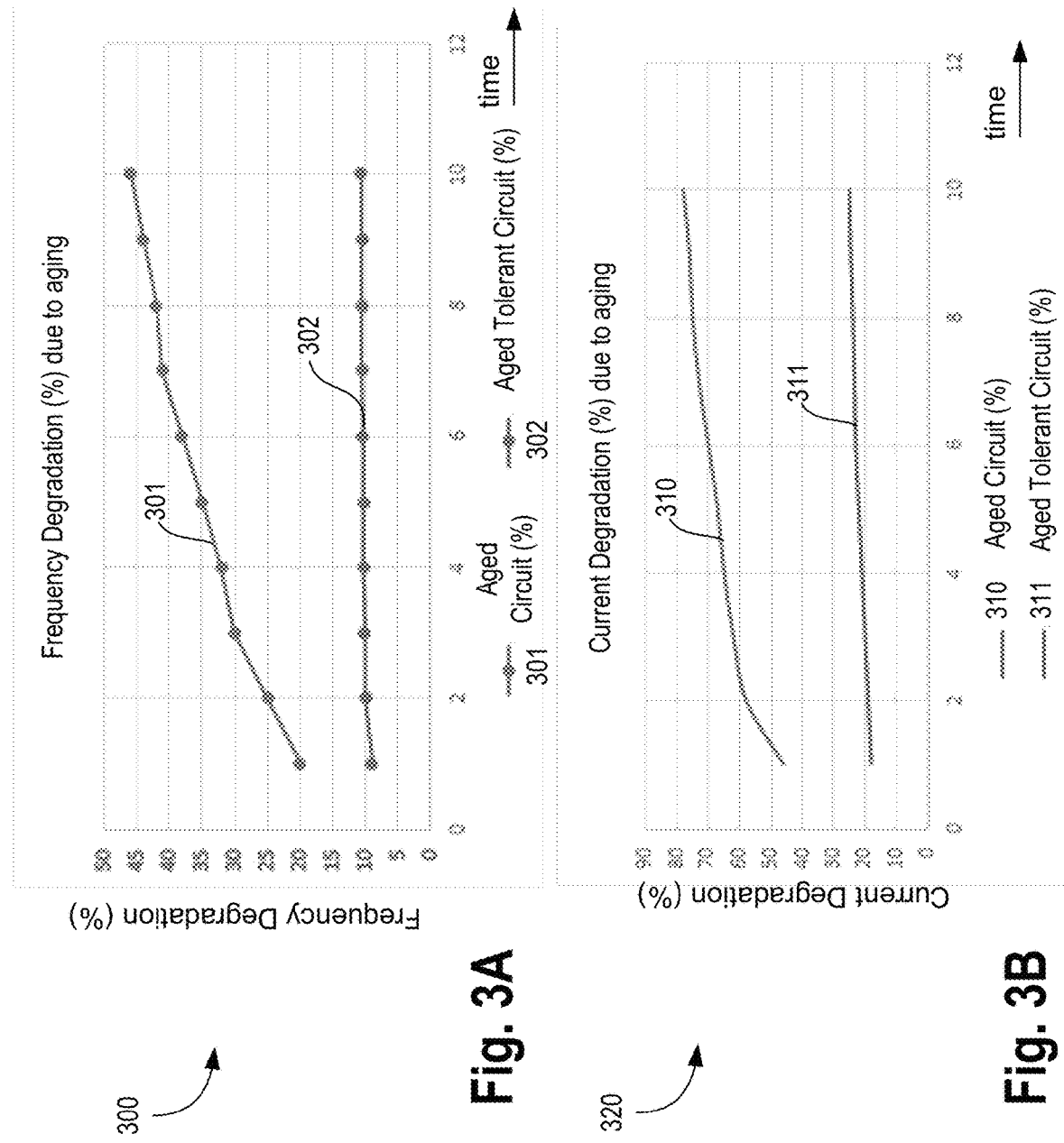
FIG. 3A illustrates a plot showing frequency degradation comparison with aged circuit (or non-aging tolerant circuit) vs. aging tolerant circuit, in accordance with some embodiments.
FIG. 3B illustrates a plot showing current degradation of aged circuit (or non-aging tolerant circuit) vs. aging tolerant circuit, in accordance with some embodiments.

FIG. 3A illustrates plot 300 showing frequency degradation comparison with aged circuit (or non-aging tolerant circuit) vs. aging tolerant circuit, in accordance with some embodiments. FIG. 3B illustrates plot 320 showing current degradation of aged circuit (or non-aging tolerant circuit) vs. aging tolerant circuit, in accordance with some embodiments. Here the aged circuit can be circuit 130 which produces data for waveforms 301 and 310, while aging tolerant circuit can be circuit 200 which produces data for waveforms 302 and 311. As time progresses, the frequency and current degradation through aging tolerant circuit 200 remains substantially constant. Conversely, the aging circuit or non-aging circuit shows performance degradation over time. The plots show that the aging tolerant circuit 200 can be used as reference circuit to gauge aging degradation in other non-aging tolerant circuits such as circuit 130.

Figure 4:
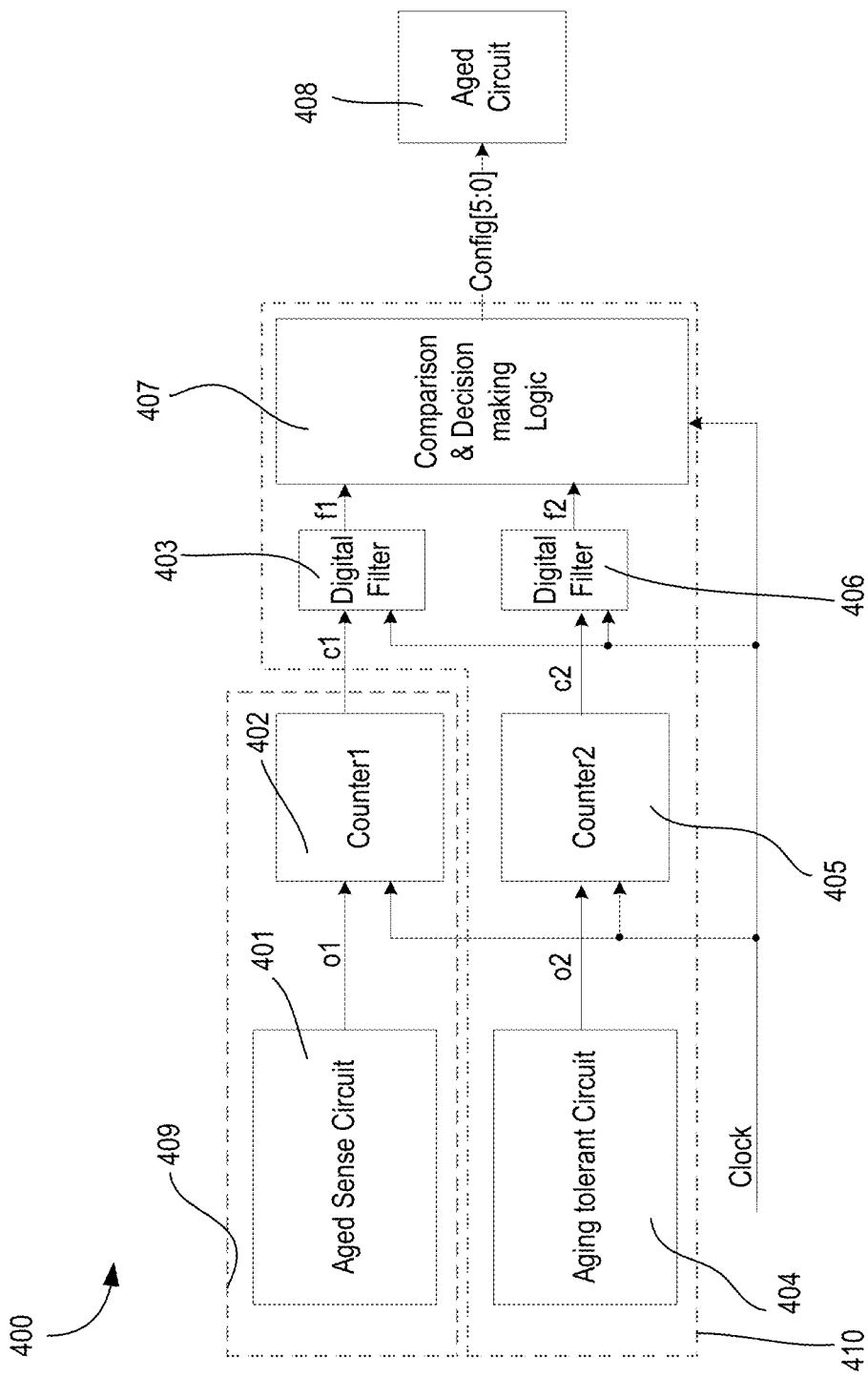
FIG. 4 illustrates an architecture for mitigating aging, in accordance with some embodiments.
Figure 5:
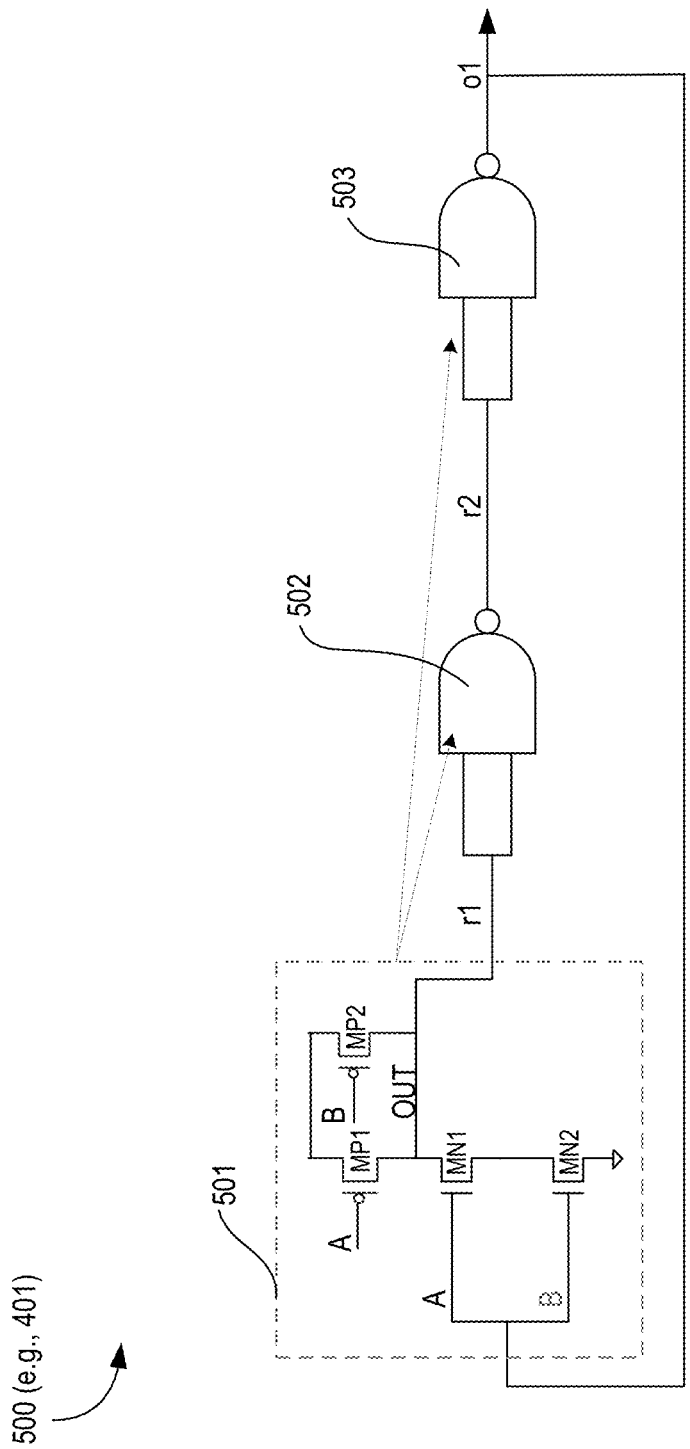
FIG. 5 illustrates an aged circuit (or non-aging tolerant circuit) configured as a ring oscillator, in accordance with some embodiments.

FIG. 4 illustrates architecture 400 for mitigating aging, in accordance with some embodiments. Architecture 400 comprises Aged Sense Circuit 401, Counter1 402, Digital Filter 403, Aging Tolerant Circuit 404, Counter2 405, Digital Filter 406, Comparison and Decision making Logic 407, and Aged Circuit 408. In some embodiments, Aged Sense Circuit 401 comprises a ring oscillator formed of non-aging tolerant circuits such as circuit 130. One such embodiment is illustrated with reference to FIG. 5. FIG. 5 illustrates an aged circuit 500 (or non-aging tolerant circuit) configured as a ring oscillator, in accordance with some embodiments. In some embodiments, circuit 500 comprises a three-stage ring oscillator, where each stage of the ring oscillator comprises a stacked transistor based inverting logic. In some embodiments, the NAND (which can also be a NOR or XOR or a replica circuit) of FIG. 1C is used as a delay or inverting stage in the ring oscillator. In some embodiments, NAND circuit is configured as an inverter by shorting its inputs A and B. In this example, three NAND gates are shown—501, 502, and 503. The output of NAND 501 is r1, the output of NAND 502 is r2, and the output of NAND 503 is o1 which is fed back as input to NAND 501 and also provided to Counter1 402. In other embodiments, other kinds of stacked transistor delay or inverting stages can be used for implementing ring oscillators. For example, NOR gates can be used instead of NAND gates.

Referring back to FIG. 4, the output o1 of Aged Sense Circuit 401 is received by Counter1 402, which counts the frequency of oscillation of clock on output o1. In some embodiments, Counter1 402 counts using Clock that can be provided from any clock source. Any suitable counter can be used for counting the frequency of the signal o1. In some embodiments, output c1 of Counter1 402 is received by a digital filter 403. Any suitable filter can be used for implementing digital filter 403. For example, a chain of registers may be used to implement digital filter 403. The number of registers may determine the filter cut off frequency. In some embodiments, a digital filter is implemented using a resettable counter. In some embodiments, the output f1 of Digital Filter 403 is provided to Comparison and Decision making Logic 407.

Figure 6:
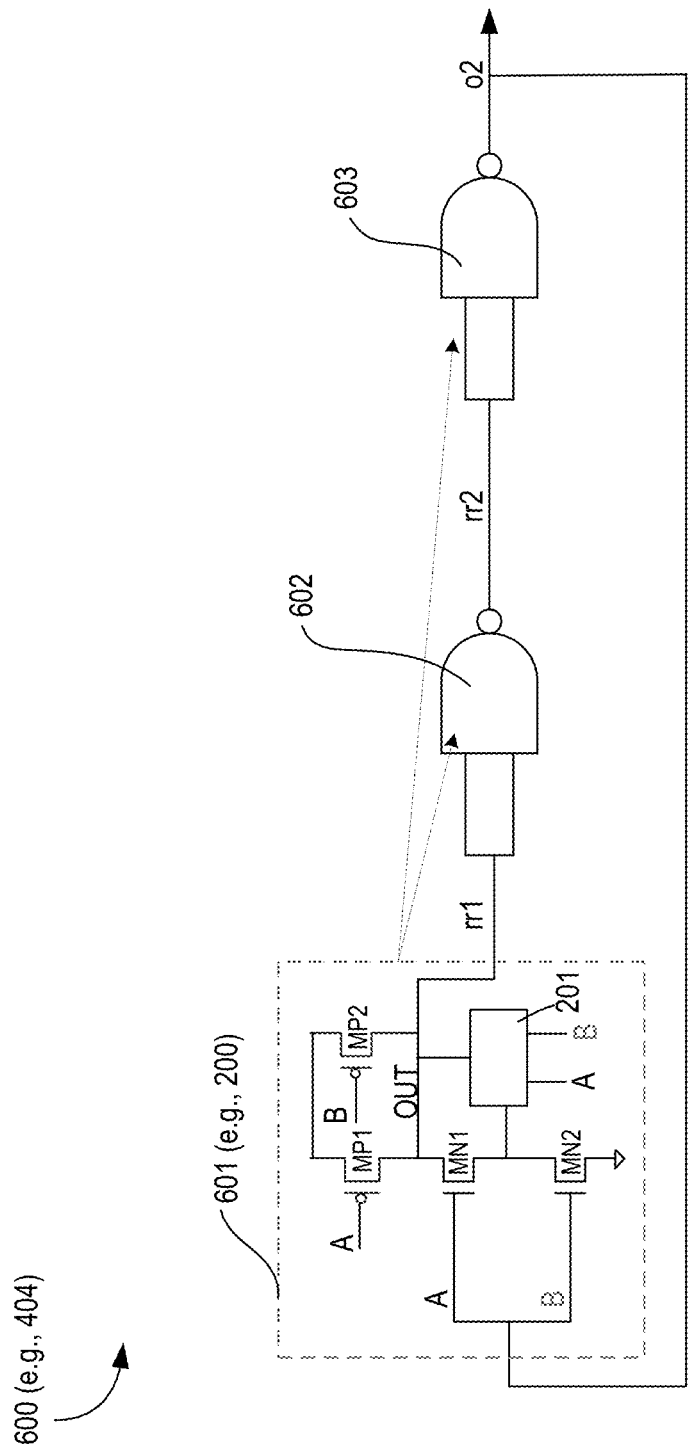
FIG. 6 illustrates aging tolerant circuit configured as a ring oscillator, in accordance with some embodiments.

In some embodiments, Aging Tolerant Sense Circuit 404 comprises a ring oscillator formed of aging tolerant circuits such as circuit 200. One such embodiment is illustrated with reference to FIG. 6. FIG. 6 illustrates an aging tolerant circuit 600 configured as a ring oscillator, in accordance with some embodiments. In some embodiments, circuit 600 comprises a three-stage ring oscillator, where each stage of the ring oscillator comprises a stacked transistor based inverting logic. In some embodiments, the NAND (which can also be a NOR, XOR or a Replica circuit) of FIG. 2 is used as a delay or inverting stage in the ring oscillator. In some embodiments, NAND circuit is configured as an inverter by shorting its inputs A and B. In this example, three NAND gates are shown—601, 602, and 603. The output of NAND 601 is rr1, the output of NAND 602 is rr2, and the output of NAND 603 is o3 which is fed back as input to NAND 601 and also provided to Counter2 505. In other embodiments, other kinds of stacked transistor delay or inverting stages can be used for implementing ring oscillators. For example, NOR gates can be used instead of NAND gates and a corresponding aging bias circuit can be coupled to the NOR gate.

Referring back to FIG. 4, the output o2 of aging tolerant sense circuit 404 is received by Counter2 405, which counts the frequency of oscillation of clock on output o1. In some embodiments, Counter2 405 counts using Clock that can be provided from any clock source. Any suitable counter can be used for counting the frequency of the signal o2. In some embodiments, the output c2 of Counter2 405 is received by a digital filter 405. Any suitable filter can be used for implementing digital filter 406. For example, a chain of registers or a resettable counter may be used to implement digital filter 405. In some embodiments, the output f2 of Digital Filter 406 is provided to Comparison and Decision making Logic 407.

In some embodiments, Comparison and Decision making Logic 407 compares the outputs f1 and f2 from the digital filters to determine if the frequencies of f1 and f2 signals are different from one another. As a side-effect of aging, a circuit slows down. As such, if frequency f1 is slower than frequency f2, then it indicates that circuit 401 is beginning to age. In some embodiments, Comparison and Decision making Logic 407 compares the frequency f1 with its previous frequency values (e.g., previously stored frequency values) to determine how much the current frequency f1 has shifted relative to its previous values. These previous values can be values that are separated by a certain period of time because aging is generally a slow process. For example, Comparison and Decision making Logic 407 stores previous values separated by 3 months, 6 month, 1 year, or 1.5 years. In some embodiments, Comparison and Decision making Logic 406 determines whether f2 is higher than f1 by at least a threshold (e.g., 15%). In one some embodiments, the threshold is programmable (e.g., by software via operating system or by hardware via registers or fuses). In some embodiments, the output of Comparison and Decision making Logic 407 is one or more bits (e.g., a configuration code of two or more bits) to control configuration parameters of an aged circuit to mitigate the aging degradation of the aged circuit.

The configuration parameters may include changing power supply levels, up-scaling or downscaling frequency of operation, changing PLL clock frequency or internally generated ring oscillator clock frequencies, command to change sizing of various transistors to change transistor design parameters (e.g., gain, bandwidth, transconductance, output impedance current driving capability, etc.), command to change biasing (current or voltage) of certain nodes, commands to change termination impedance, command to throttle input-output transceiver data rates (e.g., in memory or other High Speed applications), changing cooling system parameters (e.g., fan speed, flow of cooling agent), etc. By adjusting the configuration parameters adaptively, aging degradation of the circuits is slowed down which allows for the circuits to operate normally for a longer period of time and hence increase the useful like of a processor.

In some embodiments, various blocks of architecture 400 can be separated into different sections. For example, in some embodiments, aged sense circuit 401 and counter 402 can be positioned into an intellectual property (IP) block as indicated by section 409. The term "Intellectual Property" block or "IP Block" here generally refers to a reusable unit, logic unit, or integrated circuit layout design which is the intellectual property of a party. In some embodiments, the remaining blocks including Aging tolerant circuit 404, Counter 405, digital filter 403, digital filter 406, and Comparison & Decision Making logic 407 are part of a controller which controlled aged circuits in the IP blocks as indicated by section 410. In some embodiments, digital filter 403 is part of section 409.

Figure 7:
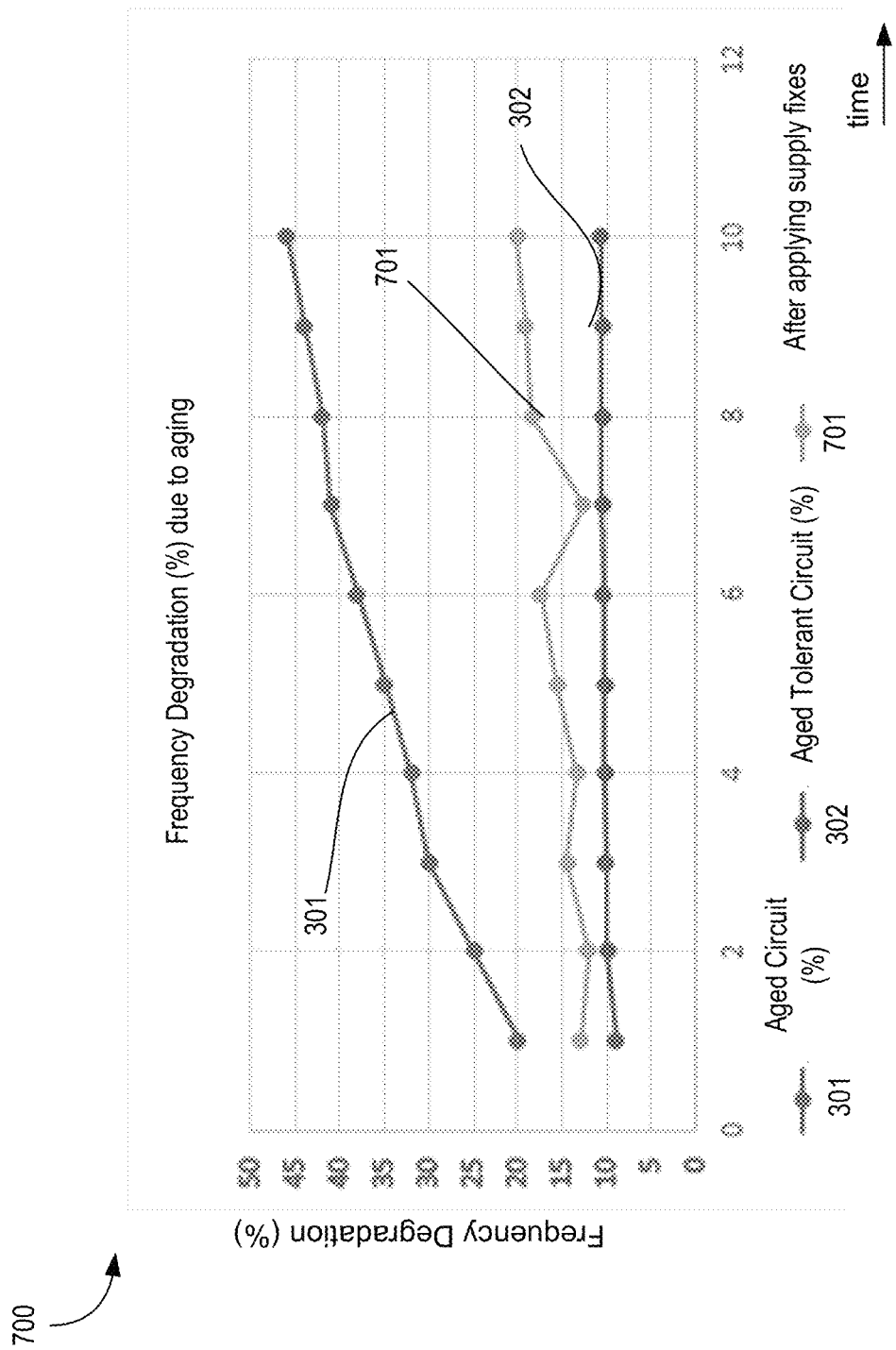
FIG. 7 illustrates a plot showing performance of the architecture for mitigating aging, in accordance with some embodiments.

FIG. 7 illustrates plot 700 showing performance of the architecture for mitigating aging, in accordance with some embodiments. Plot 700 is similar to plot 300 but with additional data 701 indicating mitigation of aging degradation. In this example, the Comparison and Decision making Logic 406 generates a configuration code to adjust a power supply to the aged circuit in a processor. For example, the power supply is lowered to slow down the aging processes which now flows the aging path of data 302.

Figure 8:
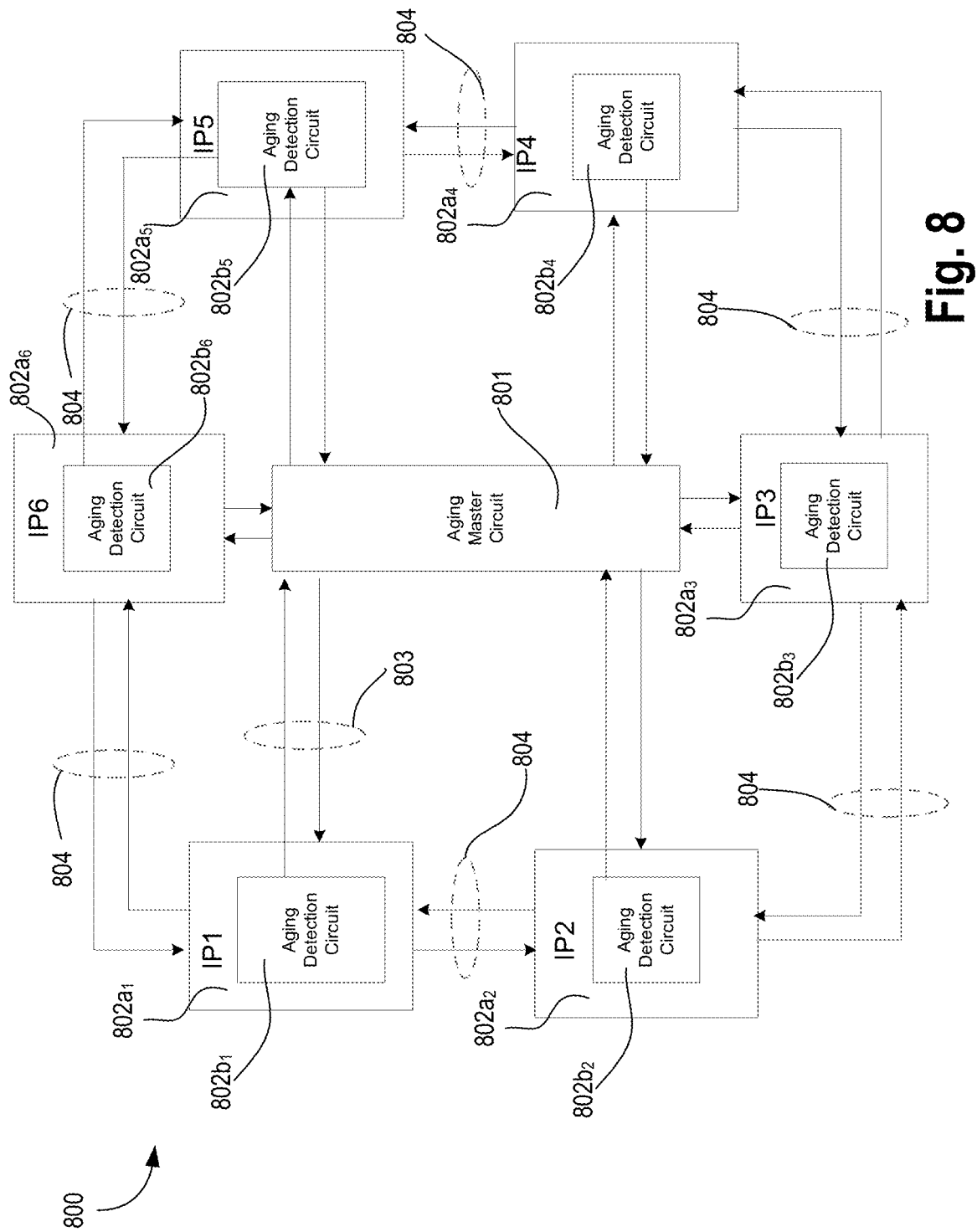
FIG. 8 illustrates an architecture for mitigating aging for multiple intellectual property (IP) blocks, in accordance with some embodiments.

FIG. 8 illustrates architecture 800 or mitigating aging for multiple intellectual property (IP) blocks, in accordance with some embodiments. Architecture 800 illustrates an aging master circuit 801 (e.g., a controller) which controls a number of IP blocks $802a_{1-6}$. In this example, six IP blocks are shown. However, any number of IP blocks can be controlled by aging master circuit 801. Each IP block has its corresponding aging detection circuit 802b. Here, six aging detection circuits $802b_{1-6}$ are shown for corresponding six IP blocks $802a_{1-6}$. In various embodiments, the IP blocks are coupled together as a ring via interfaces 804. The interface 804 can be a unidirectional interface or a bi-directional interface. In some embodiments, each IP block comprises a register which stores the output o1 from its respective counter1 (e.g., counter1 402), and that register is coupled (via interface 804) to the next register of the next IP block, and so. As such, an aging scan chain (or a scan chain to read aging data) of registers is formed that can be taped from any register by aging master circuit 801 via interface 803. Interface 803 can be a unidirectional interface or a bi-directional interface.

In various embodiments, Aging Master Circuit 801 comprises circuits of block 409. In some embodiments, Aging Master Circuit 801 collects outputs data o1 from each IP block and then generates a configuration code for all IP blocks, some IP blocks that need the code because they are aging more than others, or a single IP block because that IP block is the most active IP block compared to other IP blocks. In some embodiments, interface 803 comprises a handshake interface which establishes a connection with an IP block and then is used to enable and get aging sensing data from the IP block. In some embodiments, Aging Master Circuit 801 receives aging data (e.g., output o1) from each IP block in a round robin basis. In some embodiments, Aging Master Circuit 801 receives data from the IP blocks every predetermined period (e.g., boot time, 1 month, 2 months, 6 months, 1 year etc.).

Based on various IP aging configurations, aging mitigation is applied by Aging Master Circuit 801. For example, if an IP block is a memory block, then the configuration data from the Aging Master Circuit 801 can be used for throttling the writing or reading of data or throttling data to another channel of the memory. In one instance, another channel for memory may refer to moving data transmission of reception via a NAND memory instead of a DDR (Double Data Rate) memory. In some embodiments, configuration data from the Aging Master Circuit 801 is used to increase or decrease power supply from a regular to mitigate aging effect or device degradation in that IP block. In some embodiments, power supply to all or some IP blocks may be adjusted based on the aging data from one IP block.

Figure 9:
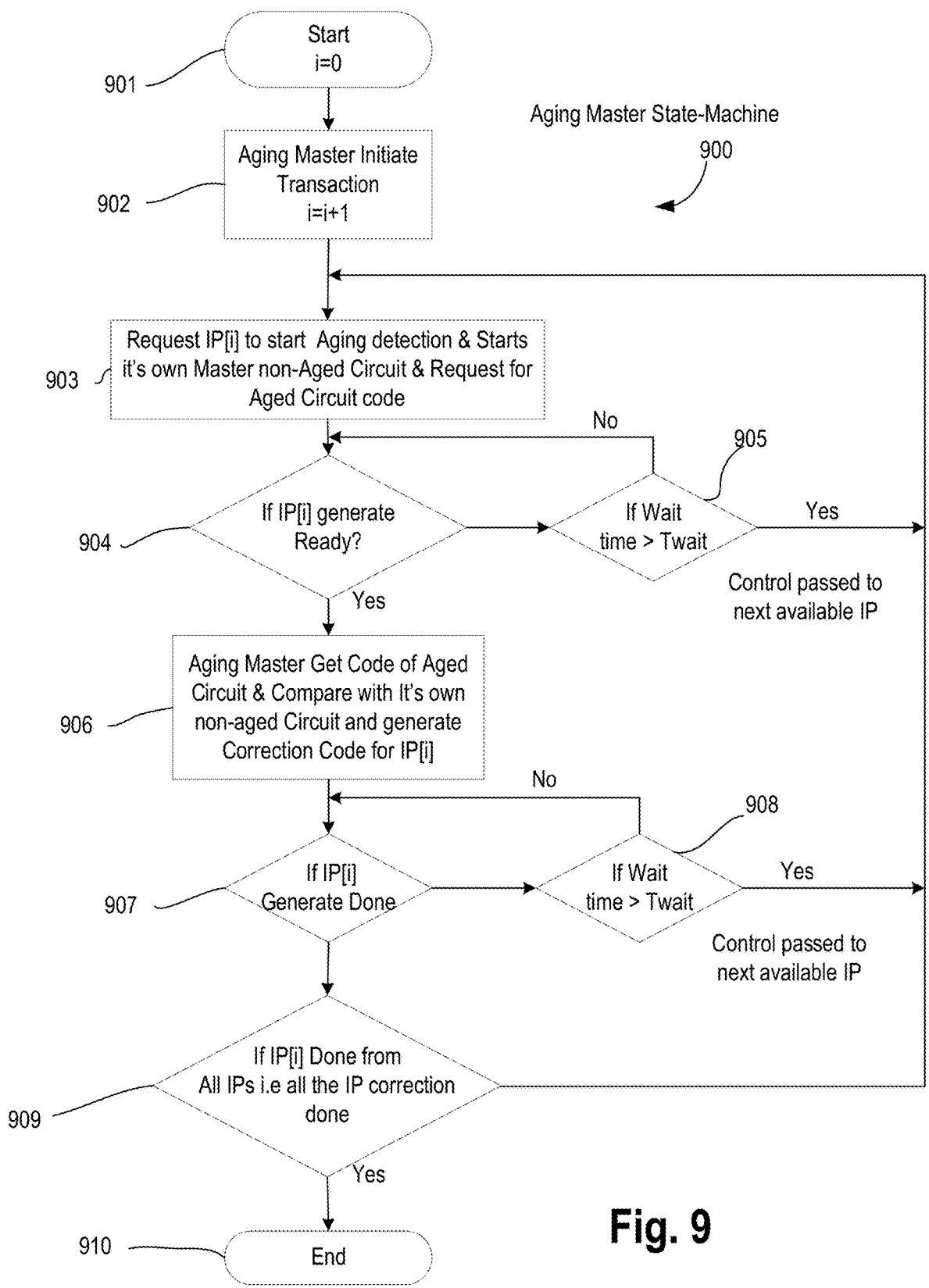
FIG. 9 illustrates a flowchart of an aging state machine for a master controller, in accordance with some embodiments.

FIG. 9 illustrates a flowchart 900 of an aging state machine for a master controller 801, in accordance with some embodiments. While various blocks in the flowchart are shown in a specific order, the order can be changed such that some blocks are performed before or after others and some blocks are performed simultaneously. At block 901, the process starts and a count variable 'i' is initialized (e.g., set to zero). At block 902, aging master circuit 801 initiates the communication or transaction, and the count is incremented by one. At block 903, aging master circuit 801 requests an IP block (e.g., 8020 to start the aging detection process using its circuit 802b1. During that time, the aging tolerant circuit (or the non-aged circuit) of circuit 801 is enabled, and a count code is generated. At block 904, the aging mater circuit 801 determines if that IP block has generated its count code and is ready is provide data. For example, the aging mater circuit 801 determines whether the IP block is awake and in active mode so it can provide the count data. If the aging mater circuit 801 determines that the IP block may not be ready (e.g., it's in sleep mode), the process proceeds to block 905. At block 905, the aging mater circuit 801 waits to see if the IP block becomes active. For example, the aging mater circuit 801 waits for a time Twait (e.g., 10 minutes) and continues to check if the IP block is ready (e.g., goes back to block 904). If after waiting for more than Twait, the IP block remains dormant or in sleep mode, the aging mater circuit 801 begins the same process for the next IP block in the chain. For example, the aging mater circuit 801 now questions IP block 802a2. In the case where previous IP block (e.g., 8020 is awake and is ready to provide count data from its ring oscillator, the processor proceeds to block 906.

At block 906, the aging mater circuit 801 receives the count code from the IP block and compares it with its own count code to generate a configuration code (e.g., Config[5: 0]) for the IP block so that the IP block can mitigate aging degradation effects in its domain. At block 907, a determination is made by the aging mater circuit 801 whether the IP block is done with providing its count data. If the IP block is not done with providing its data and/or the IP block has not yet configured its circuits to mitigate the aging, the process proceeds to block 908 which performs the same inquiry as block 905.

At block 909, the aging mater circuit 801 determines if all IP blocks in the IC are corrected or mitigated for aging. If not so, 'i' increments by one and the next IP block is questions at block 903. If all IP blocks have received their configuration codes or all IP blocks have been questioned for their codes, the process ends at block 910. The start and end blocks 901 and 910 are illustrated as examples and should not limit more operations that can be performed by the aging mater circuit 801.

Figure 10:
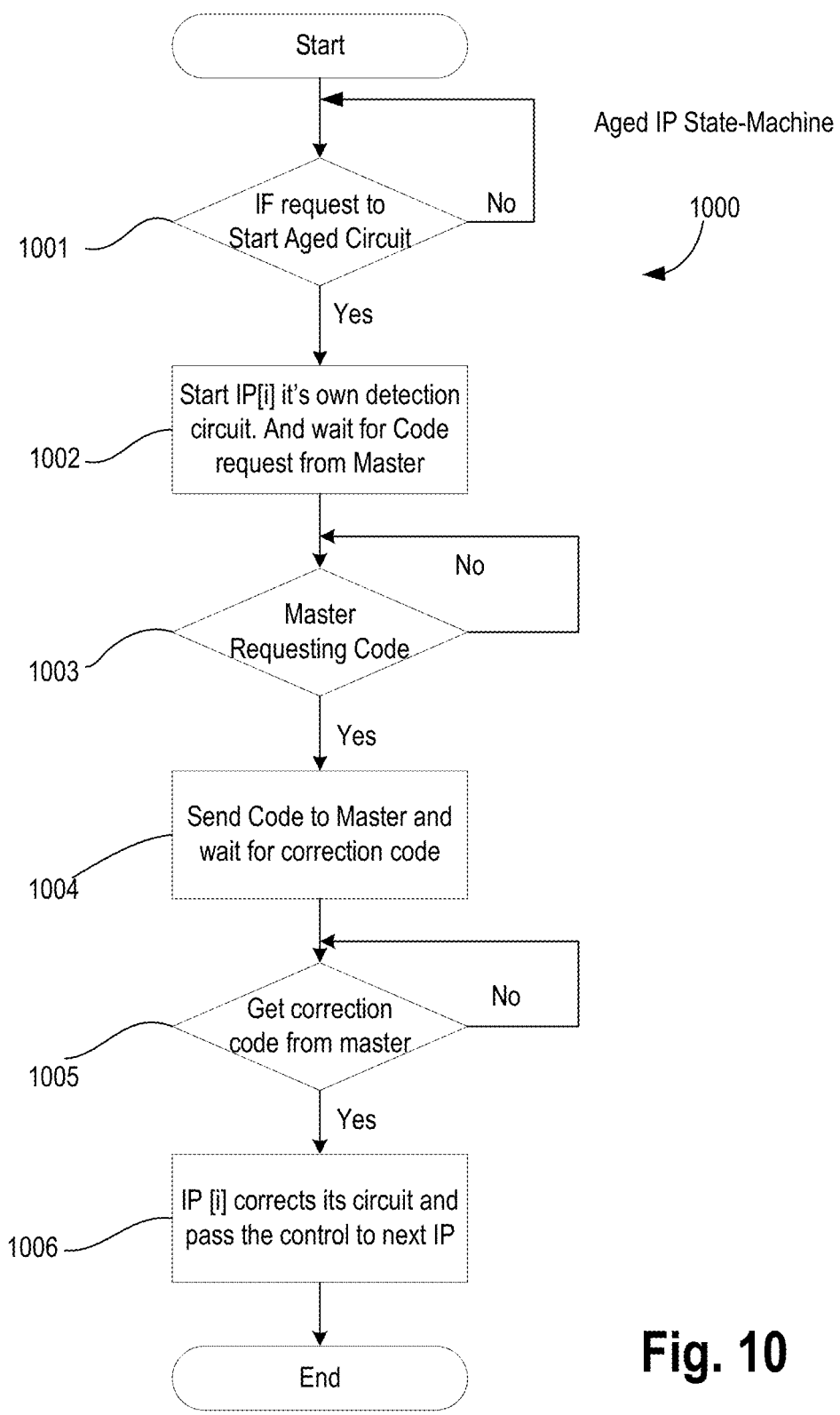
FIG. 10 illustrates a flowchart of the aging state machine for the IP block, in accordance with some embodiments.

FIG. 10 illustrates flowchart 1000 of the aging state machine for the IP block (e.g., 801a₁), in accordance with some embodiments. While various blocks in the flowchart are shown in a specific order, the order can be changed such that some blocks are performed before or after others and some blocks are performed simultaneously.

At block 1001, the IP block determines if it received as request (from the aging mater circuit 801) to start counting the frequency of its ring oscillator formed of the aged circuits. If no such request received, the IP block polls that question again to itself. If such request is received from the aging mater circuit 801, the process proceeds to block 1002. At block 1002, the IP block begins to count the frequency of its ring oscillator and generates a count code. At block 1003, the IP block determines whether the aging mater circuit 801 is requesting the count code. If the aging mater circuit 801 is ready to receive the count code from the IP block, the process proceeds to block 1004, otherwise the IP block continues to wait for the aging mater circuit 801 to be ready to receive its count code. At block 1004, the IP block sends its count code to the aging mater circuit 801. At block 1005, the IP block determines whether it received a configuration code from the aging mater circuit 801. The IP block waits in that state till it receives the configuration code. The process them proceeds to block 1006. At block 1006, the IP block applies the configuration code from the aging mater circuit 801, and then passes control to the next IP block so that the aging mater circuit 801 and provide the next IP block a configuration code.

Figure 11:
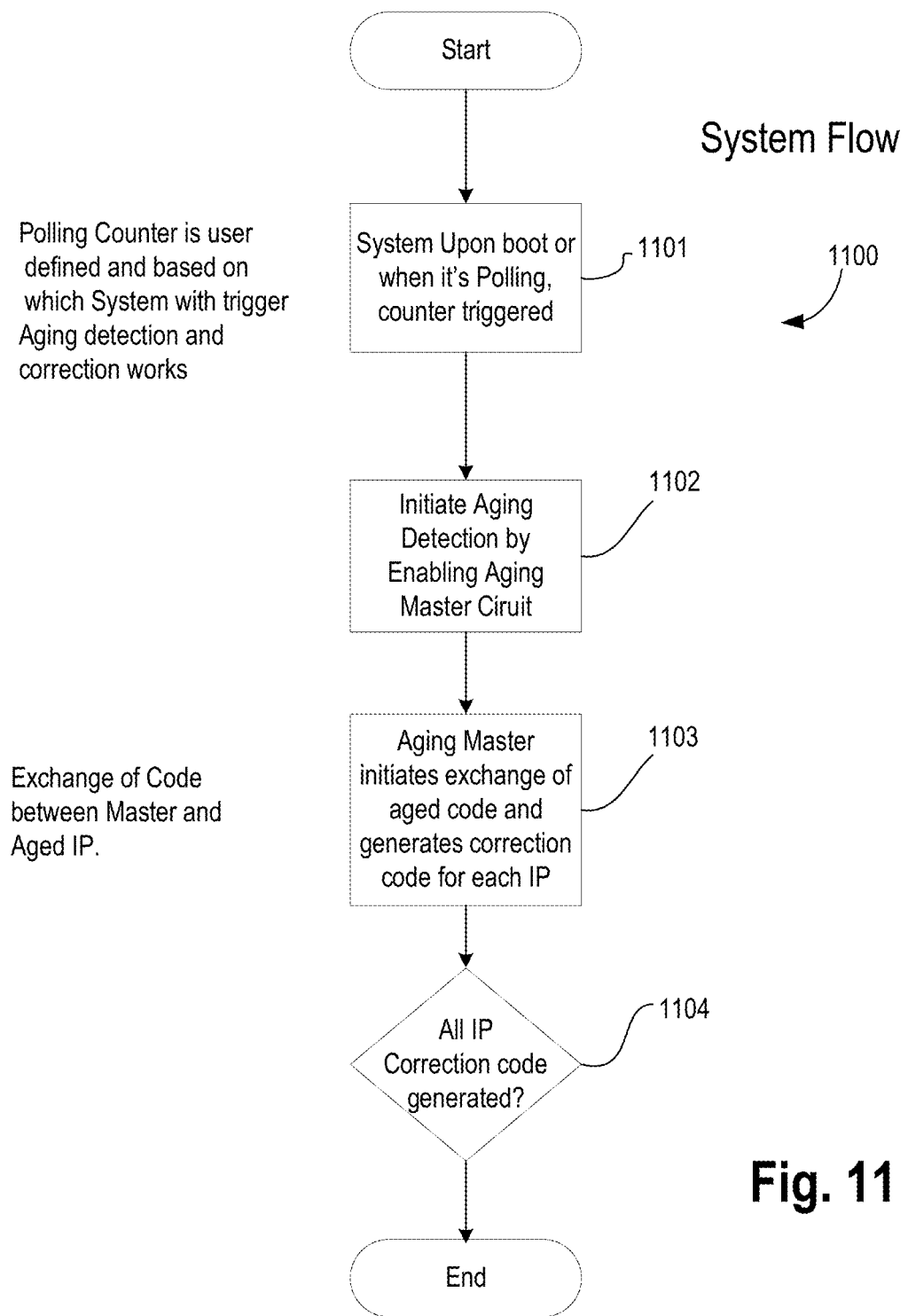
FIG. 11 illustrates a flowchart of a system for aging migration, in accordance with some embodiments.

FIG. 11 illustrates a flowchart 1100 of a system for aging migration, in accordance with some embodiments. While various blocks in the flowchart are shown in a specific order, the order can be changed such that some blocks are performed before or after others and some blocks are performed simultaneously. At block 1101, the system (e.g., IC chip, SoC, computing device, etc.) boots up or wakes up from a low power state and begins the aging mitigation process. For example, the aging mater circuit 801 begins to enquire from each IP block its count value and then determines a configuration code for them. At block 1102, the aging detection circuits in the IP block and the aging mater circuit 801 are enabled so that the count values are determined. At block 1103, the aging mater circuit 801 initiates the exchange of information between the IP block and itself. For example, the aging mater circuit 801 gets a count value from the IP block and provides it with a configuration code. At block 1104, the system (e.g., the aging mater circuit 801) determines whether all IP blocks have been addresses, and if so, the process ends, otherwise the process waits for all IP blocks to be addressed. The flowcharts of FIGS. 9-11 can be performed as computer executable instructions that are executed by a computer or any computing machine.

Figure 12:
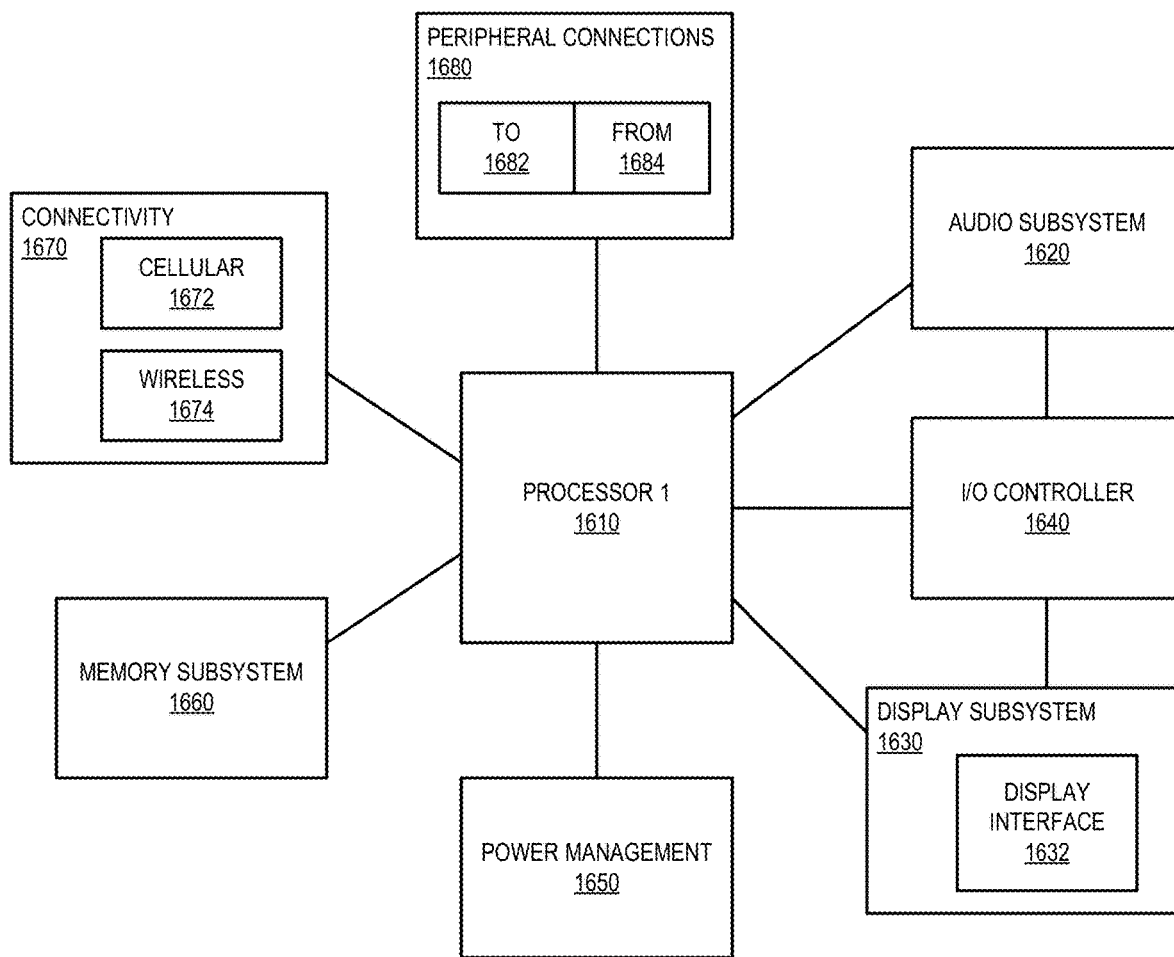
FIG. 12 illustrates a smart device or a computer system or a SoC (System-on-Chip) with aging tolerant apparatus, according to some embodiments of the disclosure.

FIG. 12 illustrates a smart device or a computer system or a SoC (System-on-Chip) with aging mitigation apparatus (e.g., architecture 400 and/or architecture 800), according to some embodiments of the disclosure. FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with aging mitigation apparatus, according to some embodiments discussed. Other blocks of the computing device 1600 may also include the aging mitigation apparatus, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment any-where the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a first ring oscillator comprising at least one aging tolerant circuitry;
   a second ring oscillator comprising a non-aging tolerant circuitry;
   a first counter coupled to the first ring oscillator, wherein the first counter is to count a frequency of the first ring oscillator;
   a filter coupled to the first counter;
   a second counter coupled to the second ring oscillator, wherein the second counter is to count a frequency of the second ring oscillator; and
   logic to compare the frequencies of the first and second ring oscillators, and to generate one or more controls to mitigate aging of one or more devices.

2. The apparatus of claim 1, wherein the filter is a first filter, wherein the
   first filter is coupled to an output of the first counter, wherein the first filter is to filter the output of the first counter and to provide a filtered output to the logic; and wherein the apparatus comprises:
   a second filter coupled to an output of the second counter, wherein the second filter is to filter the output of the second counter and to provide a filtered output to the logic.

3. The apparatus of claim 2, wherein the first ring oscillator, first counter, first filter, and logic are positioned in a controller which is coupled to two or more intellectual property (IP) blocks, and wherein the controller is to:
   compare the frequencies of the first and second ring oscillators; and
   generate the one or more controls to mitigate aging of the one or more devices in the two or more IP blocks.

4. The apparatus of claim 3, wherein the second ring oscillator and the second counter are positioned in one of the two or more IP blocks.

5. The apparatus of claim 3, wherein the two or more IP blocks are coupled in a chain.

6. The apparatus of claim 3, wherein the controller is to read data from the two or more IP blocks at boot-up or power-on events.

7. The apparatus of claim 1, wherein the aging tolerant circuitry comprises a bias circuitry to provide a bias to an internal node of a stack of transistors.

8. The apparatus of claim 1, wherein the one or more control signals include:
   a signal to adjust rise or fall times of a signal;
   a signal to adjust a clock frequency;
   a signal to adjust termination impedance of an input-output transceiver;
   a signal to adjust number of memory read or write operations;
   a signal to adjust power supply current or voltage levels;
   a signal to throttle data rate of an input-output transmitter; or
   a signal to adjust a bias voltage to an internal node of a stack of transistors.

9. A system-on-chip (SoC) comprising:
   a memory;
   a processor coupled to the memory, wherein the processor comprises:
      a plurality of intellectual property (IP) blocks coupled together in a ring configuration, wherein each IP block comprises:
         a first ring oscillator comprising a non-aging tolerant circuitry; and
         a first counter coupled to the first ring oscillator, wherein the first counter is to count a frequency of the first ring oscillator; and
      a controller coupled to each of the IP blocks, wherein the controller comprises:
         a second ring oscillator comprising an aging tolerant circuitry;
         a second counter coupled to the second ring oscillator, wherein the second counter is to count a frequency of the second ring oscillator; and
         logic to compare the frequencies of the first and second ring oscillators, and to generate one or more controls to mitigate aging of one or more devices; and
   a wireless interface to allow the processor to couple to another device.

10. The SoC of claim 9, wherein the controller is to collect a frequency count from each IP block upon power-up or boot-up of any of the IP blocks.

11. The SoC of claim 9 comprises a power management unit (PMU) coupled at least one of the IP block, wherein the controller is to control the PMU to adjust a power supply to the at least one IP block according to the one or more controls.

12. The SoC of claim 9, wherein the controller is to skip collection of a frequency count from an IP block, which is in low power mode.

13. The SoC of claim 9, wherein each IP block has a scan register to store the frequency count, wherein the scan registers of all IP blocks are coupled to form a scan-chain, and wherein the controller is to read from the scan-chain.

14. The SoC of claim 9, wherein the aging tolerant circuitry comprises a bias circuitry to provide a bias to an internal node of a stack of transistors.

15. The SoC of claim 9, wherein the one or more control signals include:
- a signal to adjust rise or fall times of a signal;
- a signal to adjust a clock frequency;
- a signal to adjust termination impedance of an input-output transceiver;
- a signal to adjust number of memory read or write operations;
- a signal to adjust power supply current or voltage levels;
- a signal to throttle data rate of an input-output transmitter; or
- a signal to adjust a bias voltage to an internal node of a stack of transistors.

16. An apparatus comprising:
a comparator to compare frequencies of first and second ring oscillators;
logic coupled to the comparator and to generate one or more controls to mitigate aging of one or more devices, wherein:
  the first ring oscillator comprises at least one aging tolerant circuitry;
  the second ring oscillator comprises a non-aging tolerant circuitry;
  the first ring oscillator is coupled to a first counter, wherein the first counter is to count a frequency of the first ring oscillator, and wherein the first counter is coupled to a filter; and
  the second ring oscillator is coupled to a second counter, wherein the second counter is to count a frequency of the second ring oscillator.

17. The apparatus of claim 16, wherein the aging tolerant circuitry comprises a bias circuitry to provide a bias to an internal node of a stack of transistors.

18. The apparatus of claim 16, wherein the one or more control signals include:
- a signal to adjust rise or fall times of a signal;
- a signal to adjust a clock frequency;
- a signal to adjust termination impedance of an input-output transceiver;
- a signal to adjust number of memory read or write operations;
- a signal to adjust power supply current or voltage levels;
- a signal to throttle data rate of an input-output transmitter; or
- a signal to adjust a bias voltage to an internal node of a stack of transistors.

19. The apparatus of claim 16:
wherein the filter is a first filter;
wherein an output of the first counter is coupled to the first filter, wherein the first filter is to filter the output of the first counter and to provide a filtered output to the logic;
wherein an output of the second counter is coupled a second filter, and
wherein the second filter is to filter the output of the second counter and to provide a filtered output to the logic.

20. The apparatus of claim 19, wherein the first ring oscillator, first counter, first filter, and logic are positioned in a controller which is coupled to two or more intellectual property (IP) blocks, and wherein the controller is to:
compare the frequencies of the first and second ring oscillators; and
generate the one or more controls to mitigate aging of the one or more devices in the two or more IP blocks.

* * * * *